(12) United States Patent
Kim et al.

(10) Patent No.: US 7,692,977 B2
(45) Date of Patent: Apr. 6, 2010

(54) VOLTAGE GENERATOR CIRCUIT CAPABLE OF GENERATING DIFFERENT VOLTAGES BASED ON OPERATING MODE OF NON-VOLATILE SEMICONDUCTOR MEMORY DEVICE

(75) Inventors: Jin-Kook Kim, Gunpo-si (KR); Jin-Yub Lee, Seoul (KR)

(73) Assignee: Samsung Electronics Co., Ltd, Suwon-Si (KR)

( * ) Notice: Subject to any disclaimer, the term of this patent is extended or adjusted under 35 U.S.C. 154(b) by 0 days.

(21) Appl. No.: 11/837,207

(22) Filed: Aug. 10, 2007

(65) Prior Publication Data

US 2008/0055991 A1 Mar. 6, 2008

(30) Foreign Application Priority Data

Aug. 29, 2006 (KR) .................. 10-2006-0082378

(51) Int. Cl.
*G11C 5/14* (2006.01)
(52) U.S. Cl. ............. 365/189.09; 365/226; 365/185.18; 365/185.25; 365/189.07
(58) Field of Classification Search ............ 365/189.09, 365/185.24, 185.26, 189.06, 189.07, 210.12, 365/218, 226, 185.18, 185.25
See application file for complete search history.

(56) References Cited

U.S. PATENT DOCUMENTS 5,596,528 A * 1/1997 Kaya et al. ............. 365/185.27
5,742,541 A * 4/1998 Tanigami et al. ......... 365/185.3
6,469,933 B2 * 10/2002 Choi et al. ............. 365/185.17
6,522,580 B2 2/2003 Chen et al.
6,731,540 B2 * 5/2004 Lee et al. ............... 365/185.17
6,771,536 B2 8/2004 Li et al.
6,778,446 B2 8/2004 Natori
6,907,497 B2 * 6/2005 Hosono et al. .............. 711/103
7,151,702 B2 12/2006 Han et al.

FOREIGN PATENT DOCUMENTS

| JP | 2002-153044 | 5/2002 |
|---|---|---|
| JP | 2003-091996 | 3/2003 |
| JP | 2003-162896 | 6/2003 |
| JP | 2005141811 | 2/2005 |
| JP | 2003162986 | 4/2008 |
| KR | 1998-037415 | 8/1998 |
| KR | 1020000020101 A | 4/2000 |
| KR | 1020040001984 A | 7/2004 |

* cited by examiner

*Primary Examiner*—Anh Phung
*Assistant Examiner*—Tha-O Bui
(74) *Attorney, Agent, or Firm*—F. Chau & Associates, LLC

(57) ABSTRACT

High voltage generator circuits and methods for operating non-volatile semiconductor memory devices are provided for use with non-volatile memory such as FLASH memory devices, to selectively generate different types of control voltages for various operating modes of non-volatile memory devices.

16 Claims, 9 Drawing Sheets

VOLTAGE GENERATOR CIRCUIT CAPABLE OF GENERATING DIFFERENT VOLTAGES BASED ON OPERATING MODE OF NON-VOLATILE SEMICONDUCTOR MEMORY DEVICE

CROSS-REFERENCE TO RELATED APPLICATION

This application claims priority to Korean Patent Application No. 10-2006-0082378, filed on 29 Aug. 2006, which is incorporated herein by reference.

TECHNICAL FIELD OF THE INVENTION

The present invention relates generally to voltage generator circuits and methods for operating non-volatile semiconductor memory devices and, in particular, multi-voltage generator circuits for use with non-volatile memory such as FLASH memory devices, which are designed to selectively generate different types of control voltages for various operating modes of non-volatile memory devices.

BACKGROUND

In general, non-volatile memory devices are solid state memory devices having memory cells that can retain stored data without electrical power or otherwise having to be periodically refreshed. There are various types of non-volatile memory including, for example, ROM (read only memory), PROM (programmable read-only memory), EPROM (erasable programmable read-only memory), EEPROM (electrically erasable programmable read-only memory) and Flash memory (also referred to as Flash EEPROM). Among the various types of non-volatile memory, flash memory technologies offer high density, low cost, high-speed data read, and electrically reprogrammable nonvolatile memory solutions, which are commonly used in various applications such as embedded applications. Flash EEPROM memory devices can be designed having NOR type or NAND type flash memory cell frameworks, as is known in the art. As compared to NOR type flash memories, NAND type flash memory provides a level of integration and a memory capacity similar to that of dynamic RAM, and is thus commonly used.

FIG. 1 is a schematic block diagram of a flash memory device (10) having a conventional architecture. In general, the flash memory device (10) includes high-voltage generator circuits (100), row decoder and control circuits (110) (or X-decoder), a memory cell array (140), a page butter (150), a column decoder (or Y-decoder) and I/O buffer (160) and a program controller (170). The voltage generator circuits (100) comprises a high voltage (Vpp) generator (101), a selection voltage (Va) generator (102), a program voltage (Vpgm) generator (103), a pass voltage (Vpass) generator (104), and a read voltage (Vread) generator (105), for generating various voltages that are used to operate the flash memory during program, read, erase operations, etc., as discussed below.

The memory array (140) comprises a plurality of transistors arranged in a matrix of rows and columns and having memory cells that are partitioned into a plurality of n memory blocks MB1~MBn (generally, MBi). The memory array (140) includes a set of row control lines that are applied to each memory block MBi. For instance, as shown in FIG. 1, row control lines input to the memory block MB1 include a string select line SSL, ground select line GSL and wordlines WL0~WL31. The row control circuit block (110) selectively activates the row control lines SSL, WL0~WL31 and GSL by applying driving voltages that are used in memory programming operations, erase operations or read operations.

A plurality of bit lines BL1~BLm (generally, BLi) are arranged in parallel and extend through all memory blocks MB1~MBn of the array (140). Each bit line BL1~BLm is operatively connected to the page buffer (150) and column decoder and I/O buffer blocks (160), which implement known functions and circuitry for reading data stored in the memory cells, for determining the states of memory cells during programming operations, for controlling potential levels of the bit lines BLi for various operating modes, and for storing data to be stored to, or read from, the memory cells. The program controller (170) generates control signal to control the functions of the column control and I/O buffer circuitry (150, 160), the row control circuitry (110) and the high-voltage generator circuits (100).

The memory array (140) depicted in FIG. 1 has a NAND type flash EEPROM memory framework, in which each memory block MBi includes a plurality of strings (or, "NAND strings") of serially connected floating gate EEPROM transistors, which are connected to corresponding ones of the bit lines BL1~BLm in each memory blocks MB1~MBn. For illustrative purposes, only one memory cell block, MB1, is illustrated in detail in FIG. 1 having a plurality of NAND strings of 32 EEPROM cell transistors M0~M31 connected in series between a source of a string select transistor SST (first select transistor) and a drain of a ground select transistor GST (second select transistor). Although FIG. 1 depicts an embodiment where each NAND cell unit is formed of 32 EEPROM floating gate transistors, NAND cells can be formed with 8 or 16 memory cells, for example.

For each NAND string, the drain of the SST is connected to a corresponding bit line BLi and the source of the GST is connected to the common source line CSL. In this regard, each NAND string is connected between a corresponding bit line BLi and reference potential provided on the CSL. The selection line SSL is commonly connected to the gate terminals of each SST in the same row of the memory block MB1, the selection line GSL is commonly connected to the gate terminals of each GST in the memory block MB1. The control gates of the EEPROM memory cell transistors M0~M31 in each NAND string are commonly connected to respective word lines WL0~WL31.

The row control circuit block (110) generally operates by decoding received address signals and selectively activating the string select line SSL, wordlines WL0~WL31 and the ground select line GSL with driving voltages that are needed in a program operation, an erase operation or a read operation. The row control circuit block (110) comprises a block decoder/driver circuit (115), a line driver block (120), and a pass gate block (130).

The line driver block (120) comprises a plurality of drivers including a string select (SS) driver (121), a word line select (Si) driver (122) and a ground select (GS) driver (123), which generate driving voltages that are output on respective selection signal lines SS, S0~S31, and GS. The selection signal lines SS, S0~S31 and SGS are activated to the required voltages by the corresponding selection circuits (or driving circuits) based on row address decoding information PA. The string select driver (121) generates and outputs string select driving signals on the SS selection line, the Si driver (122) generates and outputs wordline driving signals on selection lines S0~S31, and the GS driver (123) generates and outputs ground select driving signals on the GS selection line GS.

The pass gate block (130) includes high-voltage pass transistors PGS, P0~P31 and PSS (or generally, Pi). The ground selection line GSL, wordlines WL0~WL31, and string selection line SSL are respectively connected to the GS, S0~S31 and SS selection signal lines through respective pass transistors PGS, P0~P31 and PSS in the pass gate block (130). The gate terminals of the pass transistors Pi in the pass gate block (130) are commonly connected to a block wordline that is connected to the output of the block selection decoder/driver unit (115). The block selection unit (115) selectively generates a control signal BLKWL in response to a decoded address signal BA (block address) to drive the pass gate transistors Pi. The block selection unit (115) generates the block wordline control signal BLKWL using the VPP voltage signal generated and output from the high voltage generator (101).

The operation of a NAND type flash EEPROM memory as depicted in FIG. 1 will now be described in further detail with reference to FIGS. 7~10. FIG. 7 illustrates an EEPROM memory cell (60) having a control gate (61) and floating gate (62) stacked above a channel region (63) between drain/source diffusion regions (64) in the active region of a semiconductor layer (65). The control gate (61) is coupled to a wordline of the memory array. As is well understood in the art, the EEPROM memory cell (60) can be programmed using a Nordheim-Fowler cold tunneling process, wherein the floating gate (62) is programmed to store an amount of electric charge that corresponds to the data stored in the cell (60). In an erasing operation, control voltages are applied so that electrons are removed from the floating gate (62) to the channel region (63) and in a programming operation, electrons are injected into the floating gate (62) from the channel region (63) by Fowler-Nordheim (F-N) tunneling.

Depending on the application, the EEPROM memory cells can be operated with various storage level ranges per cell. In Single Level Cell (SLC) technology, each EEPROM memory cell can store 1 bit of data using two voltage levels, whereas in Multi-Level Cell (MLC) technology, each EEPROM memory cell can store 2 bits of data per cell, using four voltage levels. FIG. 8 is an exemplary illustration of threshold voltage distributions for a plurality of EEPROM floating gate transistors forming an array EEPROM memory cells wherein each EEPROM memory cell is programmed in a binary mode to have one or two programming states. The curve 71 represents a distribution of threshold levels of those EEPROM memory cells within a memory array that are in an erased state ("1" data state), wherein the threshold voltage levels range from −1~−3 volts. The curve 72 represents a distribution of the threshold levels of those memory cells within an array that are in a programmed state ("0" data state), wherein the threshold voltage levels range from 1~3 volts. The voltages Vo and V1 represent the verify voltage levels for the different states that are determined during programming operations and R1 (e.g., 0V) represents a read voltage that is used to read the state of the EEPROM memory cells in the binary mode.

A NAND type flash memory array such as the array (140) depicted in FIG. 1 typically performs a programming operation by erasing memory cell data block by block (sector by sector) and then programming the memory cells in the erased memory block in page units. A page may be defined to have a page size that is the same or smaller than the number of memory cells Mi commonly connected to the same wordline WLi in the memory array and accessed at the same time. For instance, in the memory cell array (140) of FIG. 1, the number m of bit lines (columns) may be 8,512, which are logically divided into interleaved even and odd columns, such that a given wordline WLi is partitioned into an odd and even page, each containing 4,256 memory cells (or 532 bytes). Since each block MBi contains 32 wordlines, each block MBi can be considered as having 64 pages, partitioned into two sub blocks of 32 pages, where each sub-block can be considered a block unit for an erase operation.

The data stored in each memory block MBi can be simultaneously erased prior to programming. A block erase process can be performed by raising the bulk substrate voltage to an erase voltage Verase of, for example, 20V and grounding the word lines of the selected unit block while placing the bit lines (BL), select lines SSL, GSL and common source line CSL of the unit block in a floating state. In a binary programming mode, the memory cells are programmed into an "erased" state having voltage thresholds that may vary in the range of −1v to −3v, as depicted in FIG. 8. Following a block erase operation, the memory cells within the unit block can be programmed on a unit page basis, as discussed below with reference to FIGS. 9 and 10.

FIGS. 9 and 10 schematically illustrate a programming operation of a NAND type flash memory device according to a conventional process. FIG. 9 schematically illustrates a unit block (90) of memory cells in the memory array (140) of FIG. 1, where it is assumed that the memory cells Mi of a selected wordline WLi for the unit block (90) represents a unit page that is selected for programming. FIG. 10 illustrates control voltages that are applied to selected and unselected wordlines in of the unit block (90) FIG. 9 to program memory cells Mi of the selected wordline Wi.

Referring to FIGS. 9 and 10, the memory cells are programmed during a program execution period by driving the applying a programming voltage Vpgm to the selected word line WLi with a programming voltage Vpgm and grounding the selected bit line(s) (i.e., bit lines connected to NAND cell units having EEMPROM cells Mi to be programmed from an erase state), while driving the unselected word lines with a pass voltage Vpass, for example 8~10V, and charging the unselected bit lines to VDD, for example 3V. Moreover, the select signal line SSL is connected to VDD and the select signal line GSL is grounded (0V).

In one technique known as ISPP (incremental step pulse programming), the programming voltage Vpgm applied to the selected WLi is a pulsed signal that is incrementally applied to the selected wordline WLi and stepped up (e.g., step size of 0.5 V) from a initial voltage (e.g., 15V) to a higher level (e.g., 18~20V) is sequential program execution periods. In periods between the Vpgm pluses, program verify operations are performed to read the programmed level of each cell being programmed to determine whether the programmed level is equal to or greater than the verify voltage level Vvfy associated with the target programming state.

More specifically, in a read and verify operation, the a read pass voltage Vread of 4.5V~5V, for example, is applied to the selection lines SSL and GSL and the unselected word lines to make the transistors SST, GST and unselected memory cells operate as pass gates. Moreover, the selected word line WLi is driven by a voltage that is specified for a given read and verify operation to determine whether a threshold voltage of the given memory cell has reached a target voltage threshold level. The selected bit lines are precharged to a high level, for example 0.7 V. If the threshold voltage is higher than the read or verify level, the potential level of the selected bit line maintains the high level, whereas if the threshold voltage is lower than the read or verify level, the potential level of the selected bit line decreases to a lower level.

As depicted in FIG. 10, during a programming operation, the control voltages Vpgm and Vvfy are sequentially applied to the selected wordline WLi in respective program execution and verify read periods of a programming cycle. Moreover, the pass voltages Vpass and Vread are sequentially applied to the unselected wordlines in respective program execution and verify read periods of the programming cycle. In the conventional memory architecture of FIG. 1, the Vpass and Vread pass voltages are high voltages (greater that supply voltage VDD) that are both applied sequentially to the same unselected W/Ls during program or verify operations, but are generated by different voltage generators (104) and (105).

SUMMARY OF THE INVENTION

Exemplary embodiments of the invention generally include voltage generator circuits and methods for operating non-volatile semiconductor memory devices. More specifically, exemplary embodiments of the invention include multi-voltage generator circuits for use with non-volatile memory such as FLASH memory devices, which are designed to selectively generate different types of control voltages for various operating modes of non-volatile memory devices.

In one exemplary embodiment of the invention, a semiconductor memory device comprises a memory array and a high-voltage generator unit to generate different constant voltages that are applied to the memory array to perform erasing, programming and reading operations. The memory array comprise blocks of non-volatile memory cells, where each block of memory cells comprises a plurality of word lines each connected to a row of non-volatile memory cells in the block. The memory array may comprise a Flash memory. The high voltage generator unit comprises a first voltage generator circuit that selectively generates a programming pass voltage (Vpass) in response to a first control signal, which is commonly applied to unselected word lines of a memory block during a programming operation or a read voltage (Vread) in response to a second control signal, which is commonly applied to the unselected word lines of a memory block during a programming verification operation.

In another exemplary embodiment, the first voltage generator circuit includes an oscillator circuit, a charge pump unit, and a detection unit. The oscillator circuit generates an oscillating signal. The charge pump unit step-ups a power supply voltage in response to the oscillating signal applied to an input to the charge pump unit. The detection unit is responsive to the first control signal to maintain an output voltage level at the output of the charge pump unit at Vpass during the programming operation. The detection unit is also responsive to the second control signal to maintain the output voltage level at the output of the charge pump unit at Vread during the programming verification operation.

In one exemplary embodiment of the invention, the detection unit comprises a first input port to input the first control signal, a second input port to input the second control signal, a third input port to input the oscillating signal output from the oscillating circuit, a fourth input port coupled to the output of the charge pump unit to detect the output voltage level at the output of the charge pump unit, and a first output port, coupled to an input of the charge pump unit, to selectively apply the oscillating signal to the input of the charge pump unit.

In another exemplary embodiment, the detection unit comprises a voltage sensor circuit connected to the output of the charge pump unit to sense the output voltage level, a comparator connected to the voltage sensor circuit to compare a sensed output voltage level with a reference voltage level and output a comparison signal and an oscillator input control circuit that is responsive to the comparison signal to control the input of the oscillator signal to the charge pump unit in response to the comparison signal.

The voltage sensor circuit may comprises a voltage divider circuit having a variable resistor and constant resistor connected in series between the output of the charge pump unit and ground, and a sense node connected between the variable resistor and constant resistor, wherein the sense node is connected to an inverting input of the comparator. A resistance value of the variable resistor may be set to either a first value in response to the first control signal input to the detection unit during the programming operation or a second value in response to the second control signal input to the detection unit during the programming verification operation.

In another exemplary embodiment, the voltage divider circuit may comprises a plurality of resistors serially connected between an output node of the charge pump unit and the sense node, a plurality of transistor switches, where each transistor switch is connected in parallel to a corresponding one of the plurality of serially connected resistors, and a switch control circuit, responsive to the first and second control signals, to selectively activate one or more of the transistor switches to set a variable resistance value between the output node of the charge pump unit and the sense node based on the first control signal or the second control signal.

These and other exemplary embodiments, aspects, objects, features and advantages of the present invention will become apparent from the following detailed description of exemplary embodiments, which is to be read in connection with the accompanying drawings.

DETAILED DESCRIPTION OF EXEMPLARY EMBODIMENTS

Figure 1:
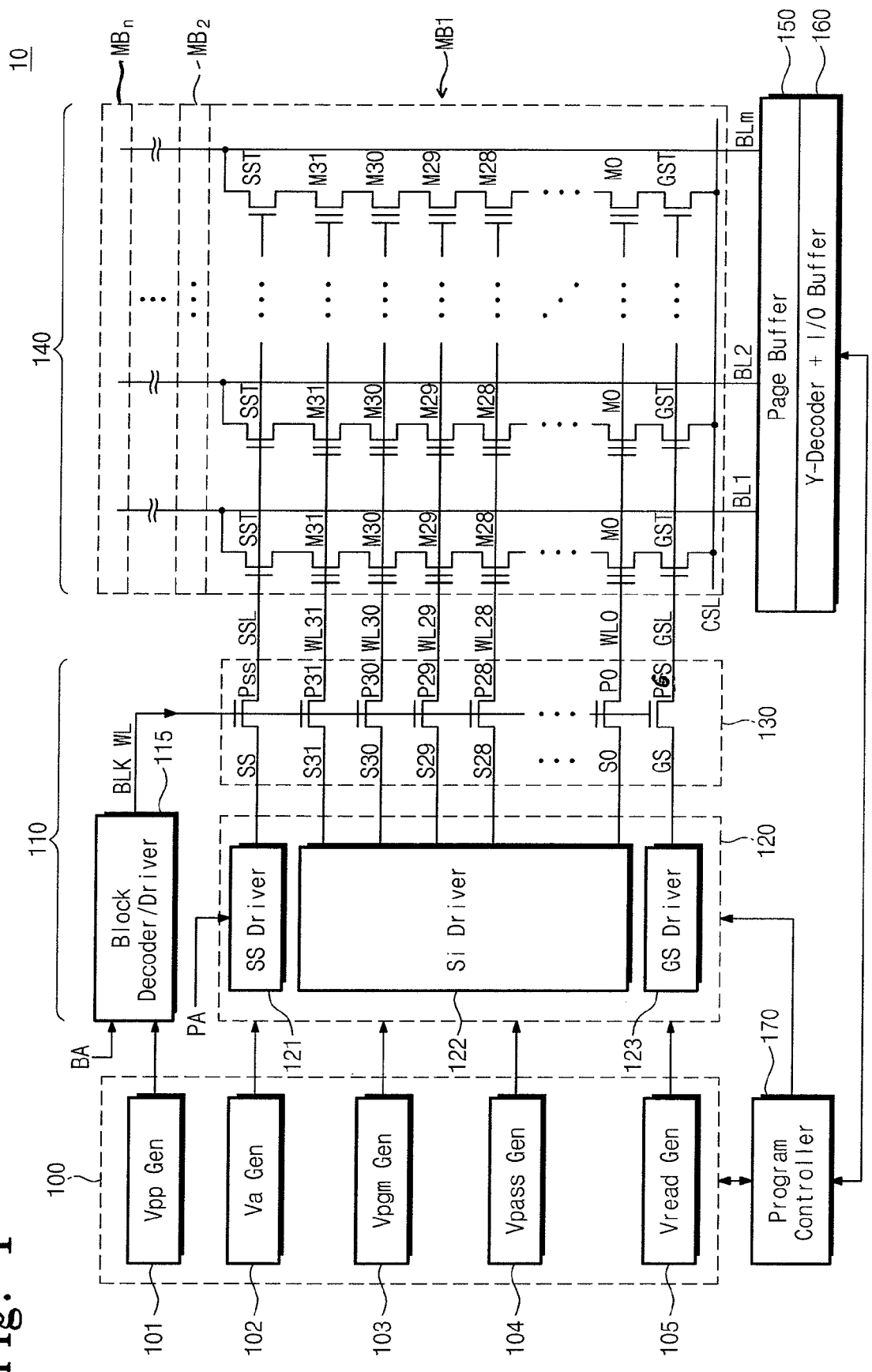
FIG. 1 is a schematic block diagram of a flash memory device having a conventional architecture.
Figure 2:
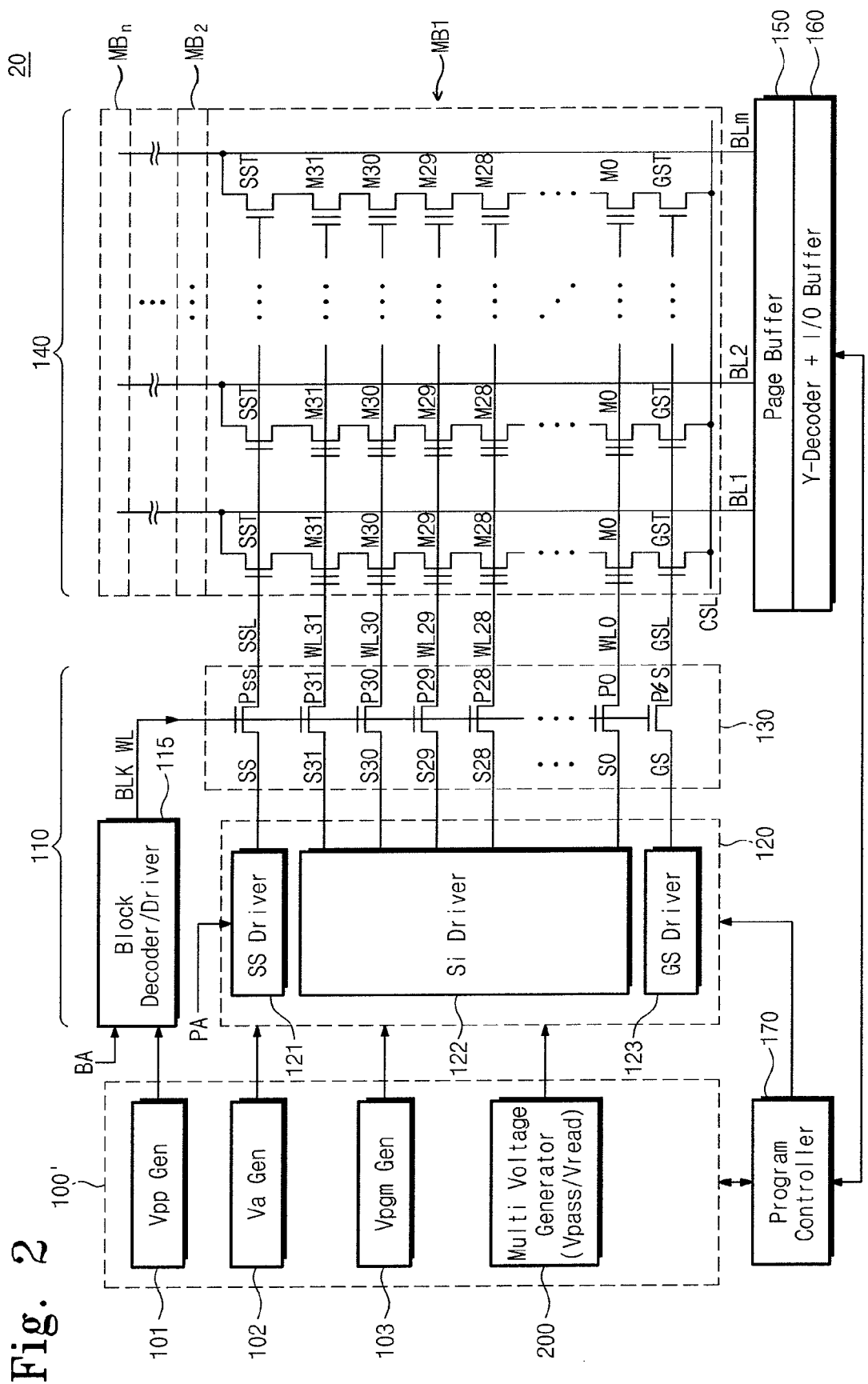
FIG. 2 is a block diagram of a flash memory device implementing a multi-voltage generator according to an exemplary embodiment of the invention.

FIG. 2 is a block diagram of a flash memory device implementing a multi-voltage generator according to an exemplary embodiment of the invention. In particular, FIG. 2 schematically illustrates a flash memory device (20) having a multi-voltage generator (200) that can selectively generate either Vpass or Vread control voltage based on the operating mode of the flash memory device (20). The exemplary flash memory device (20) has an architecture that is essentially similar to that of the flash memory device (10) of FIG. 1, except that the separate Vpass and Vread generators (104) and (105) in FIG. 1 are replaced with a single, integrated multi-voltage generator (200). As noted above, in the conventional scheme of FIG. 1, Vread and Vpass voltages are applied to the same unselected W/Ls during program or verify operations, but are generated by different voltage generators. With the exemplary framework of FIG. 2, a savings in silicon real estate and higher integration can be realized by combining the Vpass and Vread into an integrated voltage generator. The operation of the flash memory device (20) is essentially the same as that of FIG. 1 as discussed above, and thus, a detailed explanation of the constituent components and functions will not be repeated in detail.

Figure 3:
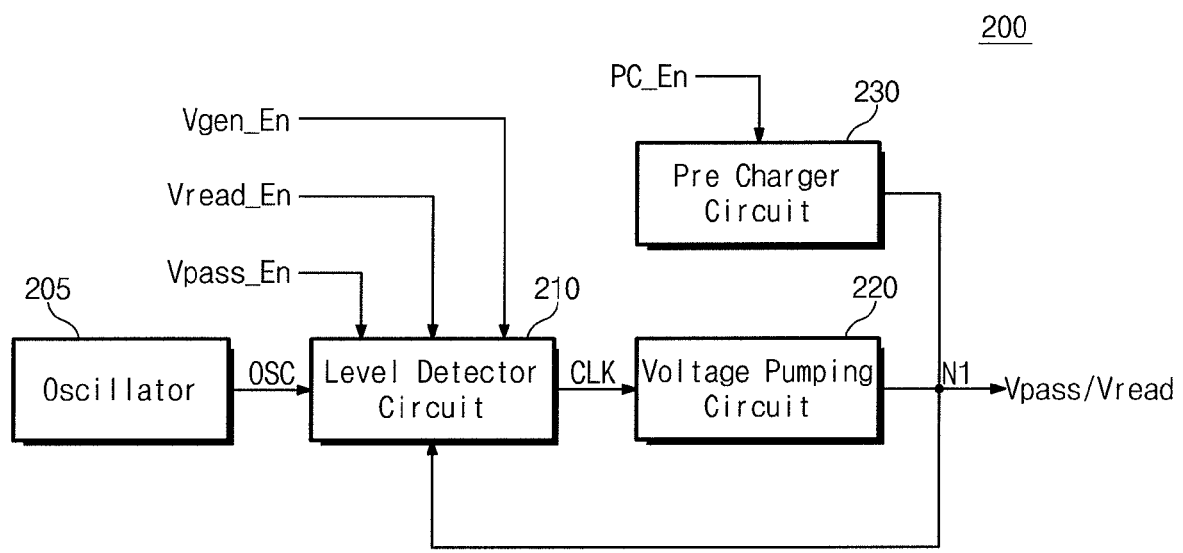
FIG. 3 is a high-level schematic block diagram of a multi-voltage generator according to an exemplary embodiment of the invention.

FIG. 3 is a schematic block diagram of a multi-voltage generator according to an exemplary embodiment of the invention. In particular, FIG. 3 schematically illustrates an exemplary embodiment of the multi-voltage generator (200) which can be implemented in the flash memory device (20) of FIG. 2 to selectively generate VPass or Vread voltages as required for different operating modes of the flash memory device (20). The multi-voltage generator (200) comprises a general framework that comprises an oscillator (205), a level detector circuit (210), a voltage pumping circuit (220), and a voltage precharger circuit (230). The multi-voltage generator (200) is responsive to control signals Vpass_En, Vread_En and Vgen_En to selectively generate Vpass or Vread voltage at an output node N1.

The multi-voltage generator (200) generally operates as follows. The oscillator (205) generates a sinusoidal signal OSC having a given frequency. The output signal OSC of the oscillator (205) is selectively output to the voltage pumping unit (220) as a clock signal CLK under control of the level detector circuit (210) according to the state of the control signals Vpass_En, Vread_En and Vgen_En applied as inputs to the level detector circuit (210). The voltage pumping unit (220) sequentially steps up the voltage at node N1 to generate Vpass or Vread in response to the CLK signal.

The voltage level at the output node N1 is fed back to the level detector unit (210), which detects the voltage level at node N1. The level detector unit (210) is enabled in response to control signal Vgen_En and Vpass_En to detect a condition when the voltage at N1 is charged to Vpass, and enabled in response to control signals Vgen_En and Vread_En to detect when the voltage at N1 is charged to Vread. When the voltage at node N1 has reached the desired level Vpass or Vread based on the operating mode, the level detector circuit (210) deactivates the CLK signal to disable the charge pumping operation of the voltage pumping unit (220) and maintain the voltage at N1 at Vpass or Vread. The voltage precharging circuit (230) discharges the voltage Vread or Vpass at node N1 to a power supply voltage VDD in response to control signal PC_En during a recovery operation between programming and read operations.

Figure 4:
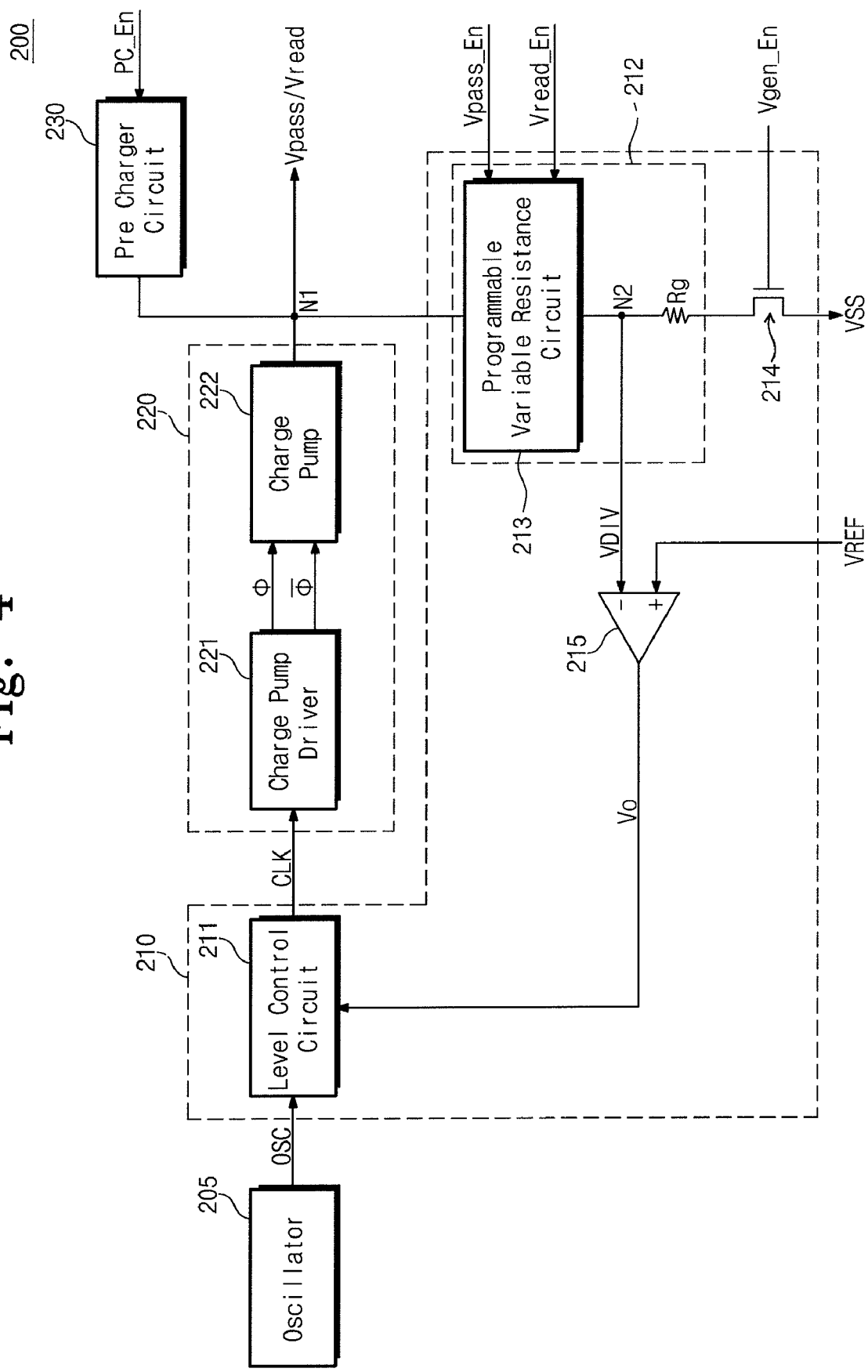
FIG. 4 is a schematic block diagram of a multi-voltage generator according to another exemplary embodiment of the invention, which is based on the general circuit topology of FIG. 3.

It is to be understood that FIG. 3 illustrates a high-level framework for implementing a multi-voltage generator according to an exemplary embodiment of the invention, which can be implemented using any suitable circuit topology to realize the functionalities described herein. For instance, an exemplary embodiment of the multi-voltage generator circuit (200) of FIG. 3 is depicted in FIG. 4, which illustrates exemplary embodiments of the level detector circuit (210) and voltage pumping circuit (220). Referring to FIG. 4, the voltage pumping unit (220) may comprise a charge pump driver (221) and a charge pump circuit (222). The level detector circuit (210) may comprise a level control circuit (211), a programmable voltage divider circuit (212) and comparator (215). The voltage divider circuit (212) comprises a programmable variable resistance circuit (213), a fixed resistance Rg and a control switch (214) (e.g., NFET) serially connected between node N1 and a ground voltage supply terminal VSS. The programmable variable resistance circuit (213) has an input terminal connected to node N1 and control inputs that receive control signals Vpass_En and Vread_En. The control switch (214) has a gate terminal that receives the control signal Vgen_En. An output node N2 of the voltage divider circuit (212) is connected to an inverting input of the comparator (215). A reference voltage VREF is applied to the non-inverting terminal of the comparator (215). The output Vo of the comparator (215) is applied as a control input to the level control circuit (211).

The multi-voltage generator (200) in FIG. 4 operates generally as follows. The level control circuit (211) receives the OSC signal output from the oscillator (205) and selectively outputs the OSC signal as a CLK signal to the charge pump driver (221) in response the control voltage V0 output of the comparator (215). The level control circuit (211) may be implemented using any suitable circuit that can generate a square wave signal CLK corresponding to the sinusoidal signal OSC. For instance, the level control circuit (211) may comprise a NAND circuit and inverter connected to the output of the NAND circuit, wherein the OSC signal and control signal Vo are applied to inputs of the NAND circuit.

The charge pump driver (221) receives clock signal CLK output from the level control circuit (211) and generates complementary charge pumping clock pulse signals $\phi$, $\bar{\phi}$, which are used to drive the charge pump circuit (222). The charge pump driver (221) may comprise any suitable circuit that can generate complementary clock signals from a clock signal CLK input. The charge pump circuit (222) may comprise any suitable circuit, which can generate an output voltage Vpass or Vread, which is larger than a supply voltage VDD from which it operates.

The charge pump circuit (222) drives the output voltage at node N1 to Vpass or Vread under control of the level detector circuit (210) as follows. The voltage at node N1 is input to the voltage divider (212), where the voltage at node N1 is divided according to a programmable resistance ratio provided by variable resistance (213) and the fixed resistance Rg to generate a divided voltage VDIV at output node N2. The divided voltage VDIV is applied to the inverting terminal of the comparator (215). Te comparator (215) compares the reference voltage VREF having a predetermined level with the divided voltage VDIV at node N2 and generates an output voltage V0 based on the comparison result which serves as a control signal applied to the level control circuit (211).

In particular, when the divided voltage VDIV is lower than the reference voltage VREF, the voltage output Vo is set at "logic high" level (logic "1") to activate the level control circuit (211). Thus, the input signal OSC is transferred to the charge pump driver circuit (221) as the CLK signal, which causes the charge pump circuit (222) to step up the voltage at node N1. Meanwhile, if the divided voltage VDIV is the same or greater than the reference voltage VREF, the voltage output Vo of the comparator is set at a logic "low" level (logic "0") to deactivate the level control circuit (211). As a result, the output signal OSC of the oscillator (205) is not transferred to the charge pump driver (221) and the charge pump (202) does not operate.

The control signals Vpass_En and Vread_En are applied to the programmable variable resistance circuit (213) and control voltage Vgen_En is applied to the gate terminal of control switch transistor (214). The control voltage Vgen_En is applied to activate/deactivate the voltage detection and control functions of the voltage detector circuit (210). When an enabling control signal Vpass_En is applied to the programmable variable resistance circuit (213), the resistance between nodes N1 and N2 is set to provide a resistance ratio so that VDIV at node N2 is the same or greater than the reference voltage VREF when the voltage at node N1 reaches the voltage level Vpass. When an enabling control signal Vread_En is applied to the programmable variable resistance circuit (213), the resistance between nodes N1 and N2 is set to provide a resistance ratio so that VDIV at node N2 is the same or greater than the reference voltage VREF when the voltage at node N1 reaches the voltage level Vread.

Figure 5:
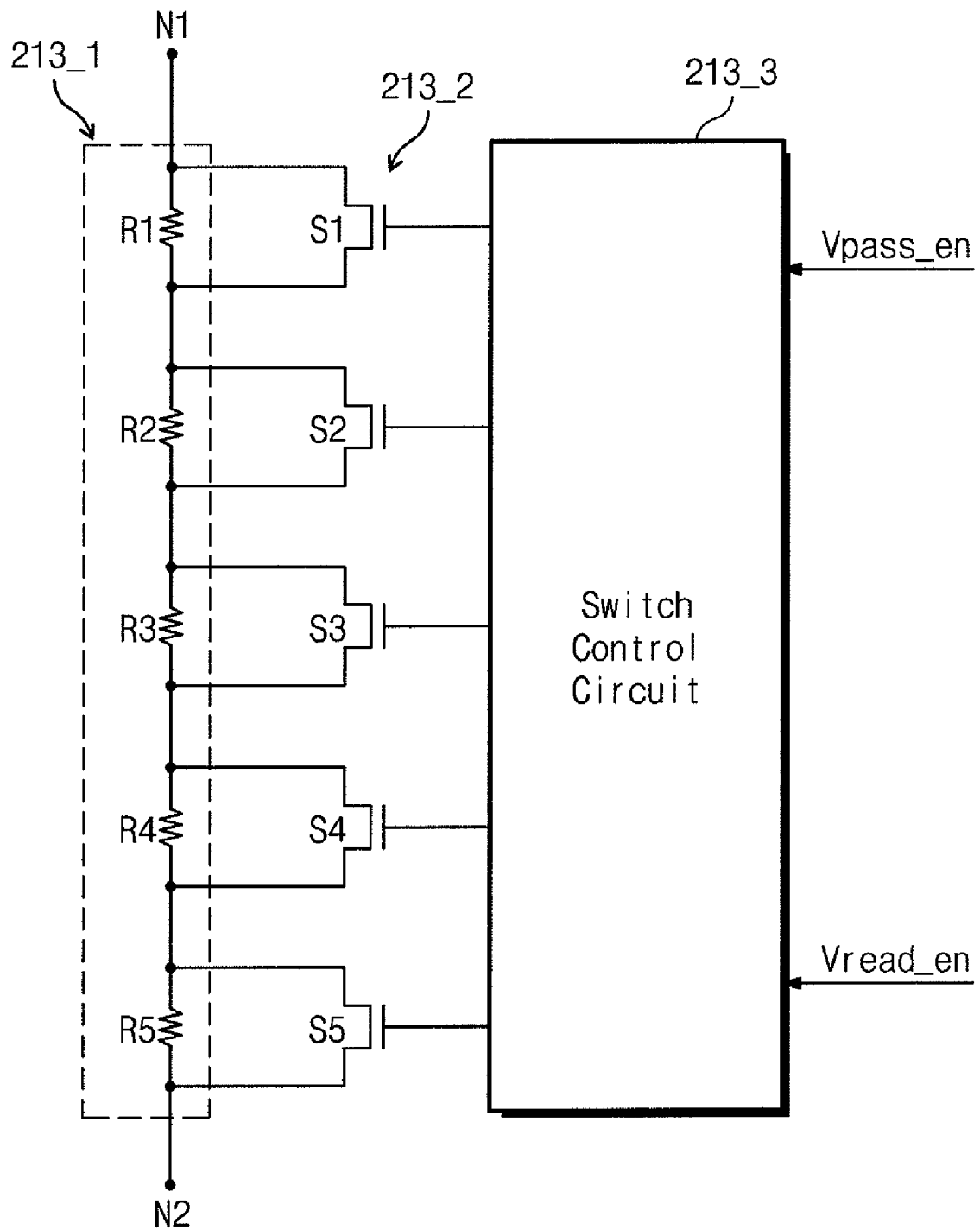
FIG. 5 is a schematic circuit diagram of a programmable variable resistance circuit according to an exemplary embodiment of the invention, which may be implemented in the multi-voltage generator of FIG. 3 or FIG. 4.

FIG. 5 is a schematic circuit diagram of a programmable variable resistance circuit according to an exemplary embodiment of the invention. In particular, FIG. 5 illustrates an exemplary embodiment of a programmable variable resistance circuit (213) that may be implemented in the multi-voltage generator (200) of FIG. 4. In general, the programmable variable resistance circuit (213) includes a resistor chain (213_1) comprising a plurality of resistors R1~R5 (213_1), a switch circuit (213_2) comprising a plurality of switches S1~S5 and a switch control circuit (213_3). The resistors R1~R5 are serially connected between nodes N1 and N2, where node N1 is connected to the output terminal of the charge pumping circuit (220) in FIG. 4 and where node N2 is the output node of the voltage divider (212) that connected to the inverting input of the comparator (215) as in FIG. 4.

Each resistor R1~R5 is connected in parallel to a corresponding switch SL~S5. In the exemplary embodiment, the switches S1~S5 are implemented as NMOS (N-channel metal oxide semiconductor) transistors having drain and source terminals connected across each corresponding resistor R1~R5 and gate terminals connected to the switch control circuit (213_3). The values of the resistors R1~R5 vary from one another.

The control signals Vpass_En and Vread_En are applied to control inputs to the switch control circuit (213_3). The switch control circuit (213_3) generates control signals that are applied to the gate terminals of the transistor switches S1~S5 based on the logic state of the control signals Vpass_En and Vread_En. In particular, the switch control circuit (213_3) applies control voltages to the gate terminals of the NMOS switches S1~S5 to selectively activate and deactivate the switches to change the total resistance between nodes N1 and N2. When a given switch Si is activated, the corresponding resistor Ri is essentially short circuited, wherein in contrast, when a given switch Si is deactivated, the corresponding resistor Ri remains as part of the resistor chain (213_1) and adding to the total variable resistance between nodes N1 and N2. The amount of resistors and/or magnitudes of the various resistors in the resistor chain (213_1) and the value of the fixed resistance are selected to achieve a desired granularity of different levels of Vpass and Vread voltages that can be generated and detected for a wide range of applications.

The voltage precharging circuit (230) discharges the voltage Vread or Vpass at node N1 to the power supply voltage VDD in response to precharge control signal PC_En during a recovery period of operation of the flash memory device following programming and read operations. During precharging, the control signal Vgen_En is applied to deactivate the control switch (215) so that the node N1 can be precharged/discharged and the voltage divider circuit (213) is disabled such that no current flows from node N1 into the voltage divider (213) (i.e., input to inverting terminal of comparator (15) is floating).

Figure 6:
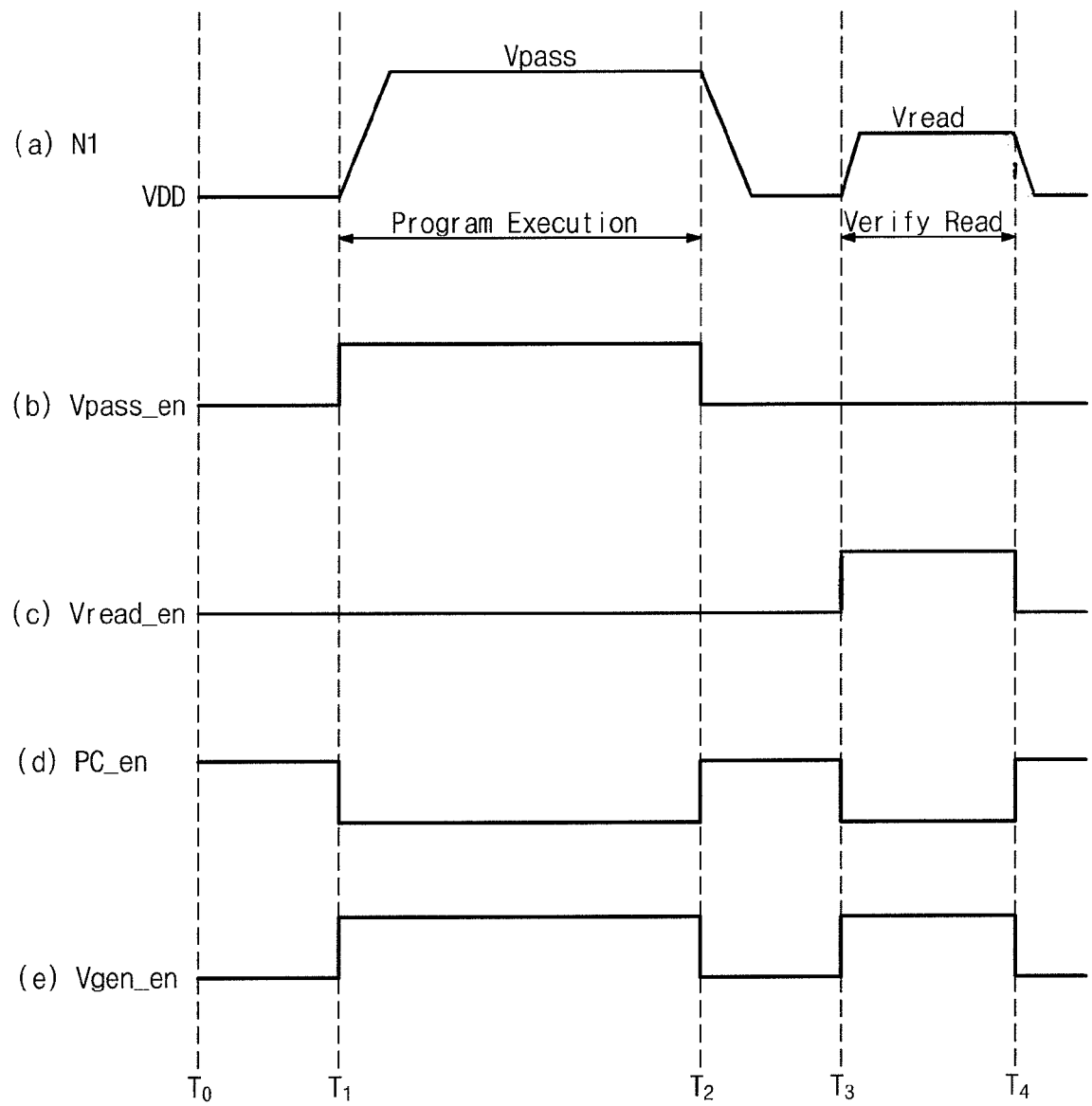
FIG. 6 is an exemplary timing diagram to illustrate a mode of operation of a multi-voltage generator circuit of FIG. 3 or 4 according to an exemplary embodiment of the invention.
Figure 7:
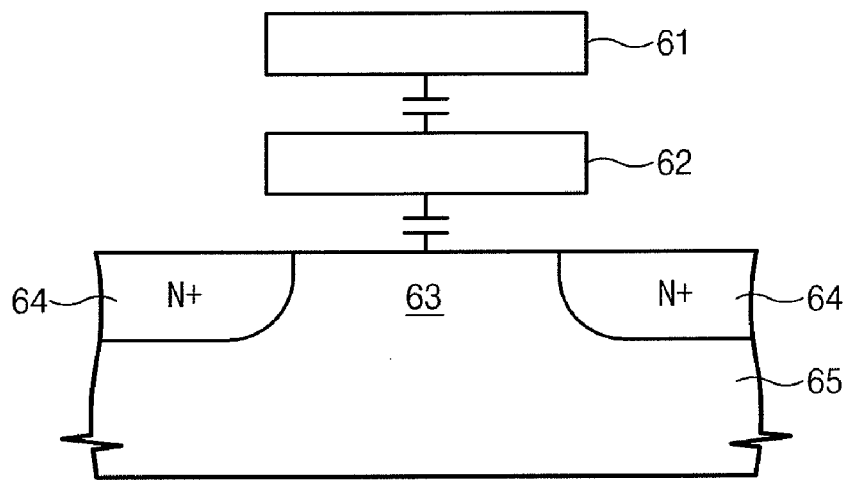
FIG. 7 illustrates an EEPROM floating gate transistor that forms a conventional memory cell.
Figure 8:
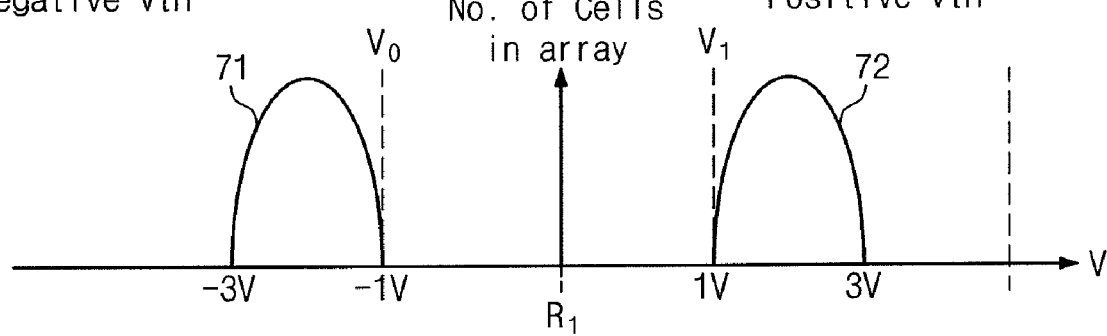
FIG. 8 is an exemplary illustration of threshold voltage distributions for a plurality of EEPROM floating gate transistors forming an array of EEPROM memory cells wherein each EEPROM memory cell is programmed in a binary mode to have one or two programming states, according to a conventional process.
Figure 9:
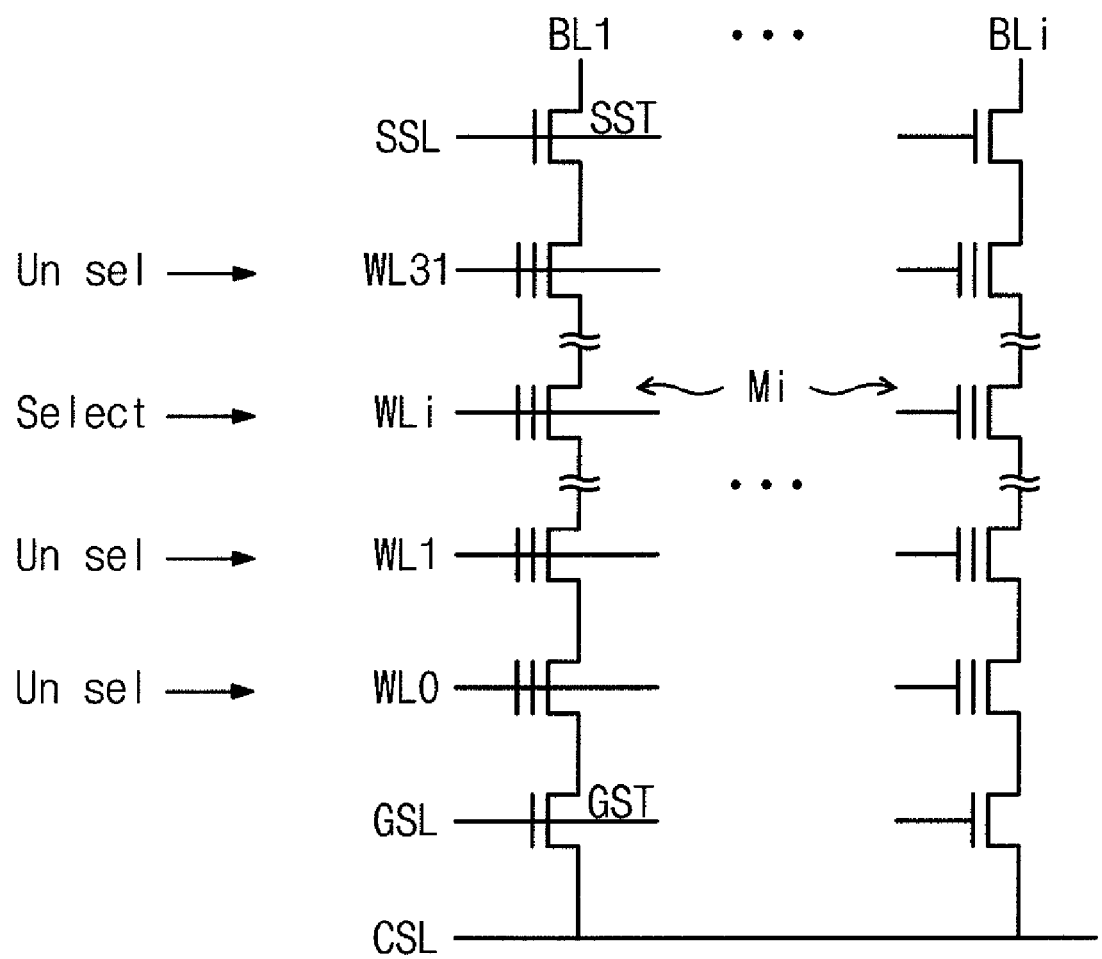
FIG. 9 schematically illustrates a unit block of memory cells of a flash EEMPROM memory array having a conventional framework.
Figure 10:
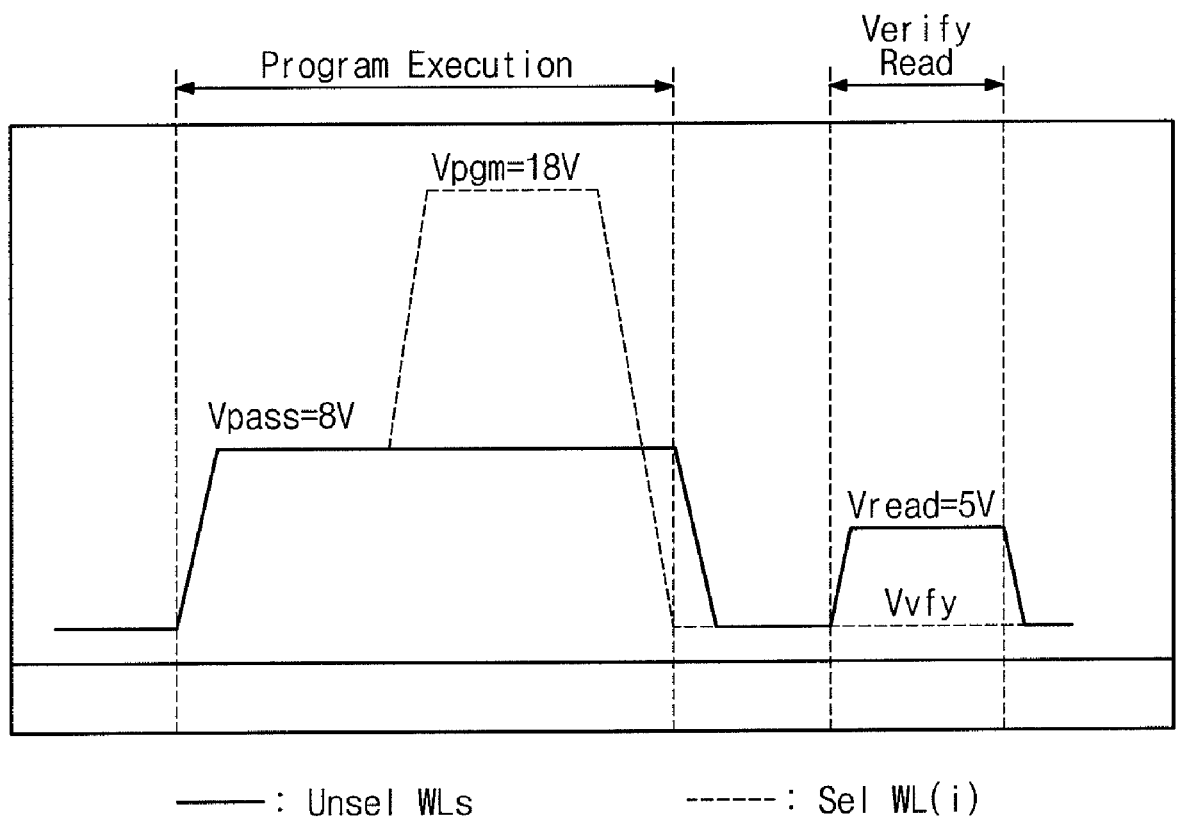
FIG. 10 is an exemplary waveform diagram that illustrates control voltages that are applied to selected and unselected wordlines in the unit block of memory cells of FIG. 9 using a conventional programming operation.

FIG. 6 is an exemplary timing diagram to illustrate a mode of operation of a multi-voltage generator circuit (200) of FIG. 3 or 4 according to an exemplary embodiment of the invention In particular, FIG. 6 depicts various waveforms including (a) voltage waveform of node N1 at the output of the multi-voltage generator (200) during one cycle of a programming/read operation, in response to control signal waveforms (b) Vpass_En, (c) Vread_En, (d) PC_en and (e) Vgen_en.

In the exemplary diagram, in the time period between to and t1, the level control circuit (210) is deactivated in response to a logic "0" level of the Vgen_En control signal (e) and the voltage at node N1 in waveform (a) is precharged to VDD by the precharger circuit (230). During the time period t0~t1, the precharger circuit (230) is activated in response to a logic "1" level of the PC_En control signal (d).

During the time period from t1~t2, a programming operation is performed where a selected wordline is biased to a programming voltage Vpgm and the unselected wordline is biased to pass voltage Vpass. At time t1, the control signal Vgen_en transitions to logic "1" to enable the level detector circuit (210) and the PC_en control signal (d) transitions to logic "0" to deactivate the precharger circuit (230). In addition, the Vpass_En signal (b) is set to logic "1." At time t1, the control signal Vpass_En is enabled (logic "1"), causing the voltage output of the multi-voltage generator at node N1 to step up to Vpass, as illustrated in waveform (a). The Vpass output is applied to the line driver circuit (122) of FIG. 2 which applies the Vpass to the unselected W/Ls during the program execution period between t1~t2.

The time period t2~t3 is a period of time following the program operation in which the voltage output at node N1 is precharged to VDD. At time t2, the Vpass_En control signal (b) is disabled (logic "0"), the PC_en signal (d) is enabled (logic "1") and the Vgen_en control signal (e) is disabled (logic "0"). In this state, the voltage detector circuit (210) is deactivated, and the voltage at node N1 is discharged from the voltage level Vpass to VDD.

Following the precharge period, a read/verify operation is performed during the time period t3~t4. At time t3, the Vread_En control signal is enabled (logic 1), the PC-en control signal is disabled (logic "0") and the Vgen_en control signal is enabled (logic "1"), which causes the multi-voltage generator (200) to generate the Vread voltage. In particular, during the period t3~t4, the voltage waveform (a) at node N1 increases from the precharged level VDD to Vread and is maintained at Vread. The Vread voltage at node N1 is applied to the line driver circuit (122) of FIG. 2 which drives the Vpass voltage to the unselected W/Ls during the read/verify period. At time t4, a precharge operation is performed to discharge the voltage at node N1 from the voltage level Vread to VDD.

It is to be understood that voltage generating circuits and methods discussed herein have application to various types of non-volatile memories, those currently existing and those contemplated to use new technology being developed, and are not necessarily limited to flash EEPROM memory applications. Exemplary embodiments of the invention have been described herein with respect to a flash electrically-erasable and programmable read-only memory (EEPROM) for illustrative purposes, and should not be considered as placing a limitation to the scope of the inventions.

In this regard, although exemplary embodiments have been described herein with reference to the accompanying drawings, it is to be understood that the invention is not limited to the exemplary embodiments described herein, and that various other changes and modifications may be readily envisioned by one of ordinary skill in the art without departing form the scope or spirit of the invention. All such changes and modifications are intended to be included within the scope of the invention as defined by the appended claims.

We claim:

1. A semiconductor memory device, comprising:
   a memory array comprising blocks of non-volatile memory cells, where each block of memory cells comprises a plurality of word lines each connected to a row of non-volatile memory cells in the block; and
   a high-voltage generator unit to generate different constant voltages that are applied to the memory array to perform erasing, programming and reading operations;
   wherein the high voltage generator unit comprises a first voltage generator circuit that selectively generates a programming pass voltage (Vpass) or a read voltage (Vread) in response to signals associated with an operation mode, and which commonly applies the selectively generated voltage to unselected word lines of a memory block,
   wherein the first voltage generator circuit comprises:
      an oscillator circuit to generate an oscillating signal;
      a charge pump unit to step-up a power supply voltage in response to the oscillating signal applied to an input to the charge pump unit; and
      a detection unit which is configured to maintain an output voltage level of the charge pump unit at Vpass during the programming operation, and which is configured to maintain the output voltage level at the output of the charge pump unit at Vread during the programming verification operation.

2. The semiconductor memory device of claim 1, wherein the detection unit comprises:
   a first input port to input the first control signal;
   a second input port to input the second control signal;
   a third input port to input the oscillating signal output from the oscillating circuit;
   a fourth input port coupled to the output of the charge pump unit to detect the output voltage level at the output of the charge pump unit; and
   a first output port, coupled to an input of the charge pump unit, to selectively apply the oscillating signal to the input of the charge pump unit.

3. The semiconductor memory device of claim 1, wherein the detection unit comprises:
   a voltage sensor circuit connected to the output of the charge pump unit to sense the output voltage level;
   a comparator connected to the voltage sensor circuit to compare a sensed output voltage level with a reference voltage level and output a comparison signal; and
   an oscillator input control circuit that is responsive to the comparison signal to control the input of the oscillator signal to the charge pump unit in response to the comparison signal.

4. The semiconductor memory device of claim 3, wherein the voltage sensor circuit comprises:
   a voltage divider circuit having a variable resistor and constant resistor connected in series between the output of the charge pump unit and ground; and
   a sense node connected between the variable resistor and constant resistor, wherein the sense node is connected to an inverting input of the comparator.

5. The semiconductor memory device of claim 4, wherein a resistance value of the variable resistor is set to either a first value in response to the first control signal input to the detection unit during the programming operation or a second value in response to the second control signal input to the detection unit during the programming verification operation.

6. The semiconductor memory device of claim 4, wherein the voltage divider comprises:
   a plurality of resistors serially connected between an output node of the charge pump unit and the sense node;
   a plurality of transistor switches, where each transistor switch is connected in parallel to a corresponding one of the plurality of serially connected resistors; and
   a switch control circuit, responsive to the first and second control signals, to selectively activate one or more of the transistor switches to set a variable resistance value between the output node of the charge pump unit and the sense node based on the first control signal or the second control signal.

7. The semiconductor memory device of claim 1, wherein the memory array comprises a Flash memory.

8. The semiconductor memory device of claim 1, wherein the high voltage generator unit comprises a second voltage generator circuit that generates a high programming voltage (Vpgm) that is applied to a selected wordline of the memory block during the programming operation.

9. A method for generating operating voltages for a semiconductor memory device comprising a memory array having blocks of non-volatile memory cells, where each block of memory cells comprises a plurality of word lines each connected to a row of non-volatile memory cells in the block, the method comprising;
   generating an oscillating signal;
   generating a first control signal to output a programming pass voltage (Vpass) from a voltage generator circuit, which is commonly applied to unselected word lines of a memory block during a programming operation, or generating a second control signal to output a read voltage (Vread) from the voltage generator circuit, which is commonly applied to unselected word lines of the memory block during a programming verification operation, the first control signal and the second control signal being associated with respective operation modes; and
   controlling an input of the oscillating signal to a charge pump unit in response to the first control signal or the second control signal to maintain an output voltage level at an output of the charge pump unit at Vpass during the programming operation or at Vread during the programming verification operation, respectively.

10. The method of claim 9, wherein controlling the input of the oscillating signal to the charge pump unit comprises:
    in response to the first control signal, detecting when an output voltage level at the output of the charge pump unit reaches Vpass during the programming operation and blocking the input of the oscillating signal to the charge pump unit to deactivate the charge pump unit and maintain the output level at Vpass; and in response to the second control signal, detecting when an output voltage level at the output of the charge pump unit reaches Vread during the programming verification operation and blocking the input of the oscillating signal to the charge pump unit to deactivate the charge pump unit and maintain the output level at Vread.

11. The method of claim 10, wherein detecting comprises:
sensing the output voltage level at an output charge pump unit;
comparing the sensed output voltage level with a reference voltage level and outputting a comparison signal; and
using the comparison signal to control the input of the oscillator signal to the charge pump unit.

12. The method of claim 11, wherein sensing the output voltage level comprises dividing the output voltage level to generate a divided reference voltage, wherein the divided reference voltage is the sensed output voltage level.

13. The method of claim 12, wherein dividing the output voltage level comprises variably dividing the output voltage level using a programmable voltage divider circuit to generate a different fist and second divided reference voltage level according to the first and second control signals, respectively, for comparison to the reference voltage level during respective programming and programming verification operations.

14. The method of claim 13, wherein variably dividing the output voltage level comprises varying a resistance between a first node and a second node, wherein the first node is connected to the output of the charge pump unit and is charged to the voltage output level, and wherein the second node is charged to the first or second divided reference voltage level that is input to the comparator.

15. The method of claim 9, wherein the semiconductor memory device is a flash memory.

16. A semiconductor memory device, comprising:
a memory array comprising blocks of non-volatile memory cells, where each block of memory cells comprises a plurality of word lines each connected to a row of non-volatile memory cells in the block; and
a high-voltage generator unit to generate different constant voltages that are applied to the memory array to perform erasing, programming and reading operations;
wherein the high voltage generator unit comprises a first voltage generator circuit that selectively generates a programming pass voltage (Vpass) or a read voltage (Vread) in response to signals associated with an operation mode, and which commonly applied applies the selectively generated voltage to unselected word lines of a memory block,
wherein the first voltage generator circuit comprises one charge pump unit to step-up power supply voltage.

* * * * *